United States Patent
Huang et al.

(10) Patent No.: US 10,826,521 B1
(45) Date of Patent: Nov. 3, 2020

(54) SUCCESSIVE APPROXIMATION REGISTER ANALOG TO DIGITAL CONVERTER AND OFFSET DETECTION METHOD THEREOF

(71) Applicant: Novatek Microelectronics Corp., Hsinchu (TW)

(72) Inventors: Chun-Po Huang, Tainan (TW); Liang-Ting Kuo, Tainan (TW); Yi-Shen Cheng, Kaohsiung (TW); Chia-Chuan Lee, Kaohsiung (TW); Soon-Jyh Chang, Tainan (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/547,547

(22) Filed: Aug. 21, 2019

Related U.S. Application Data
(60) Provisional application No. 62/831,199, filed on Apr. 9, 2019.

(51) Int. Cl.
  *H03M 1/46* (2006.01)
  *H03M 1/10* (2006.01)
  *H03M 1/12* (2006.01)

(52) U.S. Cl.
  CPC ......... *H03M 1/462* (2013.01); *H03M 1/1023* (2013.01); *H03M 1/1245* (2013.01); *H03M 1/466* (2013.01)

(58) Field of Classification Search
  CPC .... H03M 1/462; H03M 1/1245; H03M 1/466; H03M 1/1023
  USPC .................. 341/120, 155, 163, 172
  See application file for complete search history.

(56) References Cited

U.S. PATENT DOCUMENTS

| | | | | |
|---|---|---|---|---|
| 8,587,465 B2* | 11/2013 | Chen | ................... | H03M 1/0663 341/155 |
| 9,455,733 B1* | 9/2016 | Wu | ........................ | H03M 1/462 |
| 10,177,779 B2* | 1/2019 | Lee | ..................... | H03M 1/0626 |

OTHER PUBLICATIONS

Pieter J. A. Harpe et al., "A 0.A7-1.6 mW 5-bit 0.5-1 GS/s Time-Interleaved SAR ADC for Low-Power UWB Radios," IEEE Journal of Solid-State Circuits, vol. 47, No. 7, Jul. 2012, pp. 1594-1602.

(Continued)

*Primary Examiner* — Khai M Nguyen
(74) *Attorney, Agent, or Firm* — JCIPRNET

(57) ABSTRACT

A successive approximation register (SAR) analog to digital converter (ADC) and a method of detecting an offset of a comparator are introduced. The SAR ADC includes a switch circuit, a comparator and a calibration circuit. The switch circuit is configured to perform a swapping operation on a first intermediate analog signal and a second intermediate analog signal to generate a first swapped analog signal and a second swapped analog signal. The comparator is coupled to the switching circuit and is configured to compare the first intermediate analog signal and the second intermediate analog signal before the swapping operation to generate a least-significant-bit value. The comparator is further configured to compare the first swapped analog signal and the second swapped analog signal after the swapping operation to generate a calibration bit value. The calibration circuit is configured to determine whether the comparator has an offset according to the least-significant-bit value and the calibration bit value.

16 Claims, 6 Drawing Sheets

(56) References Cited

OTHER PUBLICATIONS

Bob Verbruggen et al., "A 70 dB SNDR 200 MS/s 2.3 mW dynamic pipelined SAR ADC in 28nm digital CMOS," 2014 Symposium on VLSI Circuits Digest of Technical Papers, Jun. 10-13, 2014, pp. 1-2.

* cited by examiner

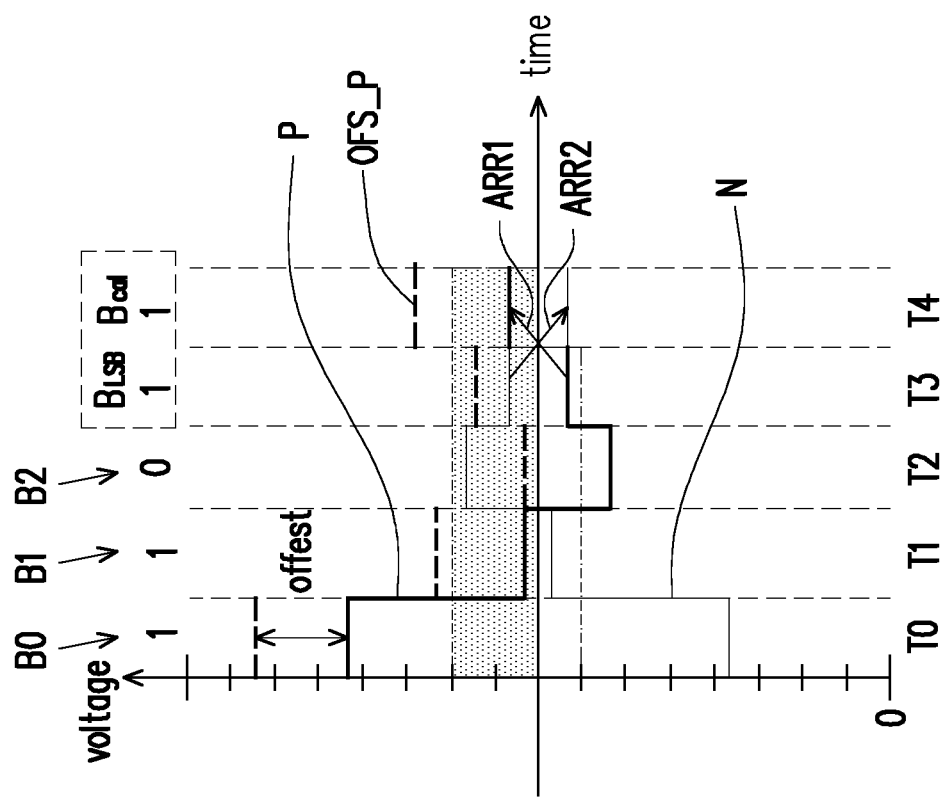
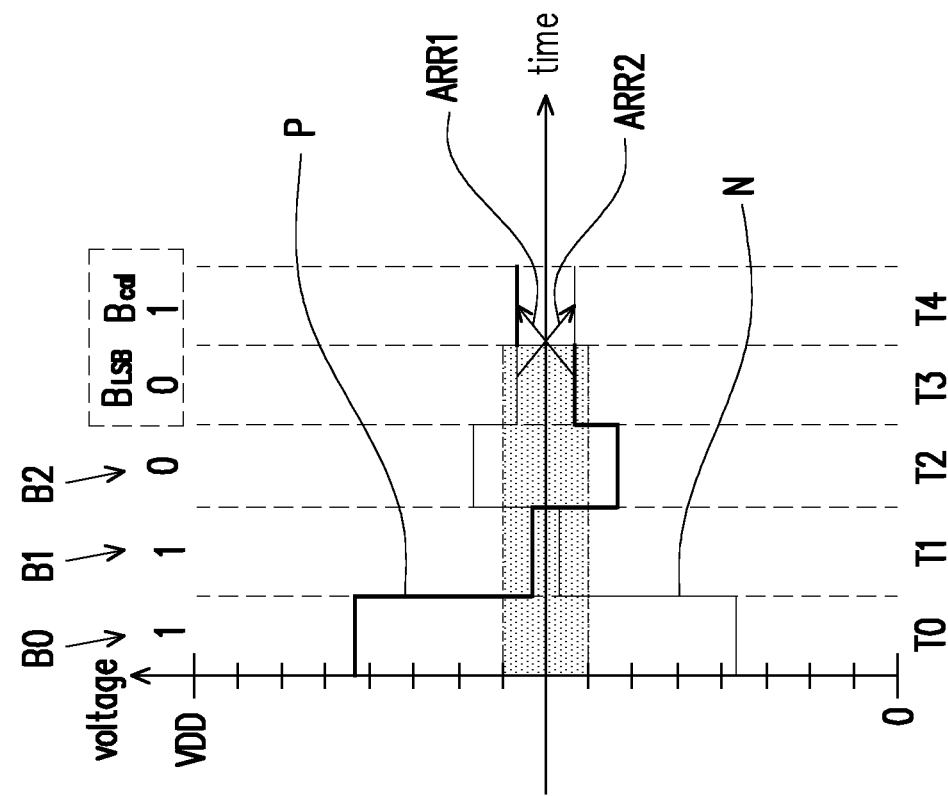
FIG. 6B
FIG. 6A

SUCCESSIVE APPROXIMATION REGISTER ANALOG TO DIGITAL CONVERTER AND OFFSET DETECTION METHOD THEREOF

CROSS-REFERENCE TO RELATED APPLICATION

This application claims the priority benefit of U.S. provisional application Ser. No. 62/831,199, filed on Apr. 9, 2019. The entirety of the above-mentioned patent application is hereby incorporated by reference herein and made a part of this specification.

BACKGROUND

Technical Field

The disclosure generally relates to analog-to-digital converter (ADC), and more particularly to "top-plate swapping" technique to detect a comparator offset in a successive approximation register (SAR) ADC that is capable of enhancing the performance and robustness of the SAR ADC.

Description of Related Art

ADCs with moderate resolution and gigahertz sampling rate are in high demand for a large number of applications in different fields such as wireless communication and consumer electronics. To achieve such high speed, the time interleaving (TI) structure is widely adopted. However, such a structure suffers from offset mismatch, gain mismatch and timing skew, which would degrade the performance of TI ADC. As demand for better performance of the ADC has grown recently, there has grown a need for a more creative technique to efficiently detect offset mismatch.

Nothing herein should be construed as an admission of knowledge in the prior art of any portion of the present disclosure.

SUMMARY

A SAR ADC and a method of detecting offset that are capable of enhancing the performance and robustness of the SAR ADC are introduced.

In some embodiments, the SAR ADC includes a switch circuit, a comparator and a calibration circuit. The switch circuit is configured to perform a swapping operation on a first intermediate analog signal and a second intermediate analog signal to generate a first swapped analog signal and a second swapped analog signal. The comparator is coupled to the switching circuit and is configured to compare the first intermediate analog signal and the second intermediate analog signal before the swapping operation to generate a least-significant-bit value. The comparator is further configured to compare the first swapped analog signal and the second swapped analog signal after the swapping operation to generate a calibration bit value. The calibration circuit is configured to determine whether the comparator has an offset according to the least-significant-bit value and the calibration bit value.

In some embodiments, the method of detecting an offset of a comparator includes steps of comparing a first intermediate analog signal and a second intermediate analog signal to determine a least-significant-bit value; performing a swapping operation on a first intermediate analog signal and a second intermediate analog signal to generate a first swapped analog signal and a second swapped analog signal; comparing the first swapped analog signal and the second swapped analog signal after the swapping operation to generate a calibration bit value; and determining whether the comparator has the offset according to the least-significant-bit value and the calibration bit value.

To make the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIGS. 6A and 6B are timing diagrams illustrating waveforms of signals without and with comparator offset in accordance with some embodiments.

DESCRIPTION OF THE EMBODIMENTS

It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
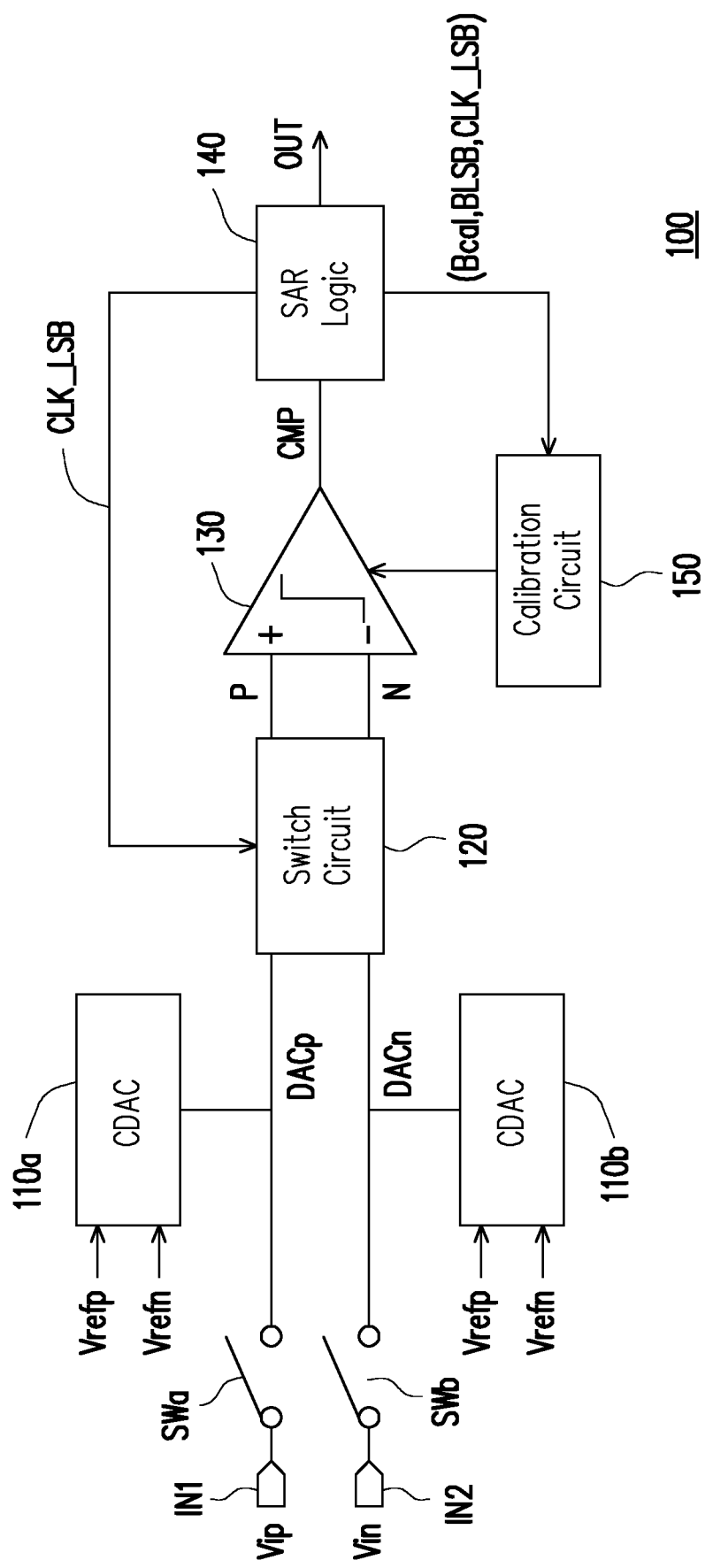
FIG. 1 is a schematic diagram illustrating a successive approximation register (SAR) analog to digital converter (ADC) in accordance with some embodiments.

Referring to FIG. 1, a schematic diagram of a successive approximation register (SAR) analog to digital converter (ADC) 100 is illustrated. The SAR ADC 100 may include input terminals IN1 and IN2, switches SWa and SWb, capacitor arrays 110a and 110b, a switching circuit 120, a comparator 130, a SAR logic 140 and a calibration circuit 150. The input terminals IN1 and IN2 are configured to receive analog input signals Vip and Vin, respectively. The SAR ADC 100 may covert the analog input signals Vip and Vin to a digital output OUT that corresponds to the analog input signals Vip and Vin.

The switch SWa is coupled between the input terminal IN1 and the capacitor array 110a; and the switch SWb is coupled between the input terminal IN2 and the capacitor array 110b. The switches SWa and SWb are switched on or off according to at least one control signal. In some embodiments, the at least one control signal for controlling the switches SWa and SWb are a clock signal that are generated by a clock generator (not shown). However, the disclosure is not limited thereto, an any control signal that are capable of switching on or off the switches SWa and SWb falls within the scope of the disclosure.

The capacitor array 110a may include a plurality of capacitors (not shown) arranged in array. In some embodiments, the capacitor array 110a is configured to receive the analog input signal Vip and reference signals Vrefp and Vrefn, and is configured to generate an intermediate analog signal DACp according to the analog input signal Vip and the reference signals Vrefp and Vrefn. Similarly, the capacitor array 110b may include a plurality of capacitors (not shown) arranged in array. In some embodiments, the capacitor array 110b is configured to receive the analog input signal Vin and reference signals Vrefp and Vrefn, and is configured to generate an intermediate analog signal DACn according to the analog input signal Vin and the reference signals Vrefp and Vrefn.

In some embodiments, the SAR ADC 100 may further include a sample and hold circuit (not shown) that is configured to sample and hold the analog input signals Vip and Vin to generate the sampled signals corresponding to the analog input signals Vip and Vin. In addition, the capacitor arrays 110a and 110b may act as capacitive digital-to-analog converter (CDAC) that may generate the intermediate analog signals DACp and DACn according to the reference signals Vrefp, Vrefn and the sampled signals corresponding to the analog input signals Vip and Vin.

The switch circuit 120 is coupled between the capacitor arrays 110a, 110b and the comparator 130. The switch circuit 120 is configured to receive the intermediate analog signals DACp and DACn from the capacitor arrays 110a and 110b and output signals P and N (e.g., may also be referred to as top-swap voltages) to the comparator 130 according to a control signal CLK_LSB. In some embodiments, the switch circuit 120 may perform a swapping operation (or a top-plate swapping operation) to interchange the intermediate analog signals DACp and DACn to generate the signals P and N. For example, before the swapping operation, the intermediate analog signal DACp is outputted as the signal P, and the intermediate analog signal DACn is outputted as the signal N. After the swapping operation, the intermediate analog signal DACp is outputted as the signal N, and the intermediate analog signal DACn is outputted as the signal P. In some embodiments, after a least-significant-bit (LSB) of the digital output OUT has been decided, the switch circuit 120 performs the swapping operation to interchange the intermediate analog signals DACp and DACn.

The comparator 130 is coupled to the switching circuit 120 to receive the signals P and N from the switching circuit 120. The comparator 130 is configured to compare the signals P and N to generate a comparison result CMP. In some embodiments, before the swapping operation, the intermediate analog signals DACp and DACn have not been interchanged and are outputted as the signals P and N, respectively. The comparator 130 may compare the signals P and N to generate a first comparison result. After the swapping operation, the intermediate analog signals DACp and DACn are interchanged and are outputted as the signals N and P, respectively. The comparator 130 may compare the signals P and N to generate a second comparison result. The first comparison result may be used to determine a LSB $B_{LSB}$ and a calibration bit Bcal.

The SAR logic 140 is coupled to the comparator 130 and is configured to generate a digital output OUT according to the comparison result CMP. In some embodiments, the SAR logic 140 may store a digital value having a plurality of bits, and each bit of the digital value is updated during a sequence of comparation operations performed by the comparator 130. The digital output OUT is generated at an end of the sequence of the comparison operations. For example, the sequence of the comparison operations is ended when the comparison operation for determining the LSB $B_{LSB}$ is completed, and the value of the LSB $B_{LSB}$ is updated. After the LSB $B_{LSB}$ is determined, the SAR logic 140 may control the switch circuit 120 to perform the swapping operation (e.g., "top-swap operation") to interchange the intermediate analog signals DACp and DACn to generate the swapped analog signals. An additional comparison operation is performed to compare the swapped analog signal to determine value of the calibration bit Bcal. The SAR logic 140 may provide the LSB $B_{LSB}$ and the calibration bit Bcal to the calibration circuit 150.

The calibration circuit 150 is coupled between the comparator 130 and the SAR logic 140, and is configured to detect offset of the comparator 130 according to the LSB $B_{LSB}$ and the calibration bit Bcal. The calibration circuit 150 is further configured to correct the detected offset of the comparator 130.

Figure 2:
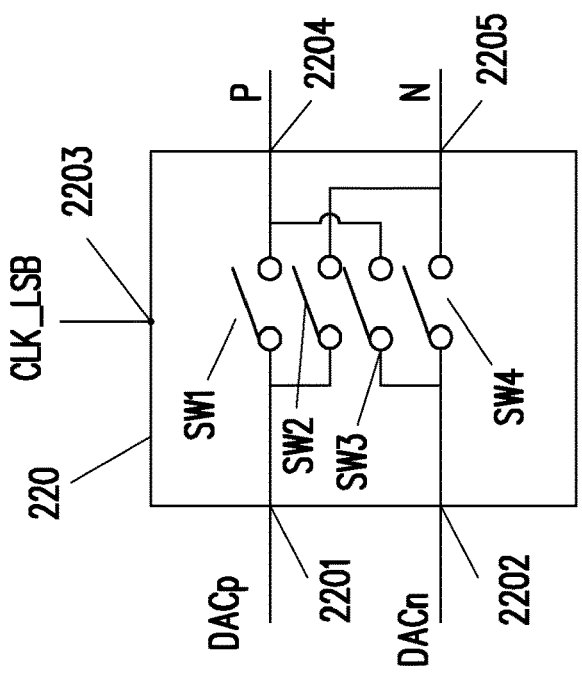

Referring to FIG. 2, a switch circuit 220 in accordance with some embodiments are illustrated. The switch circuit 220 includes input terminals 2201 and 2202, a control terminal 2203, and output terminals 2204 and 2205. The input terminals 2201 and 2202 are configured to receive the intermediate analog signals DACp and DACn, respectively; the control terminal 2203 is configured to receive a control signal (e.g., CLK_LSB); and the output terminals 2204 and 2205 are configured to output the signals P and N. The switch circuit 220 may generate the signals P and N according to the control signal (e.g., CLK_LSB) and the intermediate analog signals DACp and DACn. In some embodiments, the switch circuit 220 includes a plurality of switches SW1 through SW4, in which each of the switches SW1 through SW4 is coupled between one of the input terminals 2201 and 2202 of the switch circuit 220 and one of the output terminals 2204 and 2205 of the switch circuit 220. For example, the switch SW1 is coupled between the input terminal 2201 and the output terminal 2204; the switch SW2 is coupled between the input terminal 2201 and the output terminal 2205; the switch SW3 is coupled between the input terminal 2202 and the output terminal 2204; and the switch SW4 is coupled between the input terminal 2202 and the output terminal 2205. In some embodiments, before the swapping operation, the switch circuit 220 is configured to turn on the switches SW1 and SW4 to electrically connect the input terminals 2201 and 2202 to the output terminals 2204 and 2205, respectively. After the swapping operation, the switch circuit 220 is configured to turn on the switches SW2 and SW3 to electrically connect the input terminals 2201 and 2202 to the output terminals 2205 and 2204, respectively. In some embodiments, the switch circuit 220 is a double bootstrapped switch that is adopted with monotonic switching, thereby improving a linearity of the switch circuit 220.

Figure 3:
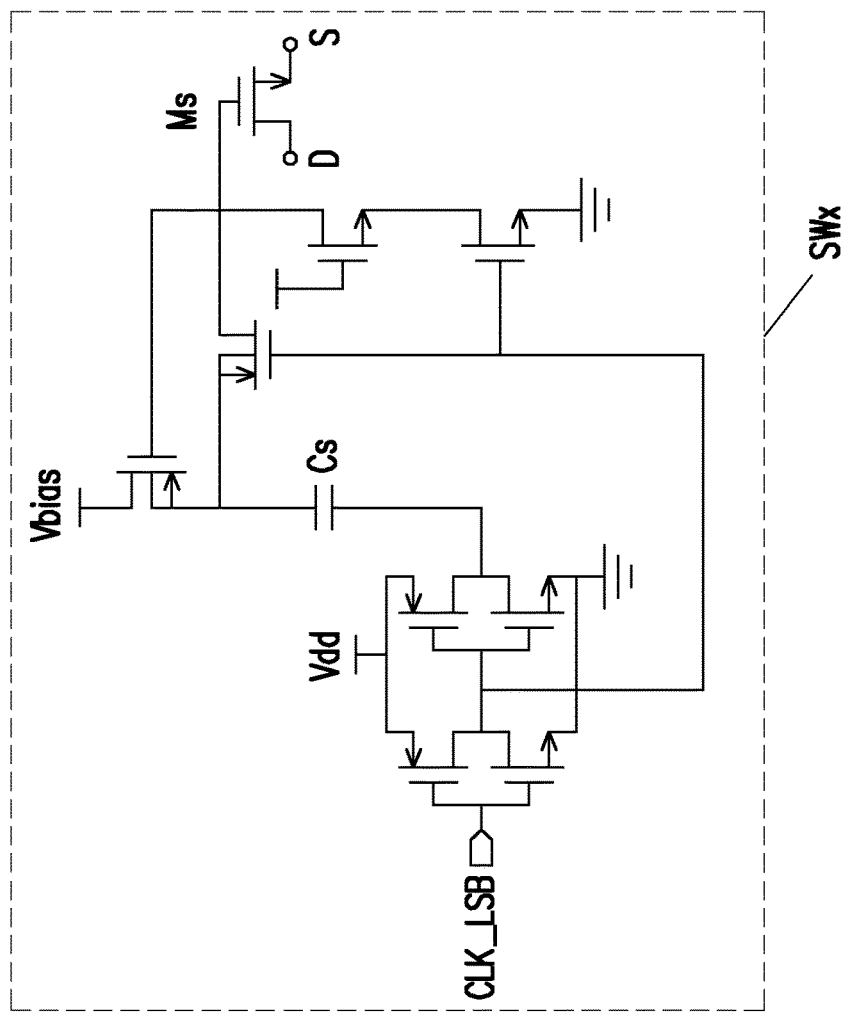
FIGS. 2 through 3 are schematic diagrams illustrating a switching circuit of a SAR ADC in accordance with some embodiments.

Referring to FIG. 3, a structure of a switch SWx which may be any one of the switches SW1 through SW4 of the switch circuit 220 in accordance with some embodiments is illustrated. The switch SWx may include a boost capacitor Cs and a transistor Ms. The drain terminal D of the transistor Ms is coupled to the input terminal 2201 or 2202 of the switch circuit 220, and the source terminal S of the transistor Ms is coupled to the output terminal 2204 or 2205 of the switch circuit 220.

At the beginning, the boost capacitor Cs is pre-charged to a level of a bias voltage Vbias. In some embodiments, the level of the bias voltage Vbias is smaller than the level of a reference voltage Vdd to improve a reliability of the switch circuit 220. When the control signal CLK_LSB arrives, the boost capacitor Cs may generate a boosted voltage which is provided to a gate of the transistor Ms. For example, a level of the boosted voltage is Vdd+Vbias. The transistor Ms is controlled by the boosted voltage to perform the switching operation of the switch SWx to electrically connect or electrically insulate the input terminals 2201 and 2202 to the output terminals 2204 and 2205.

Figure 4:
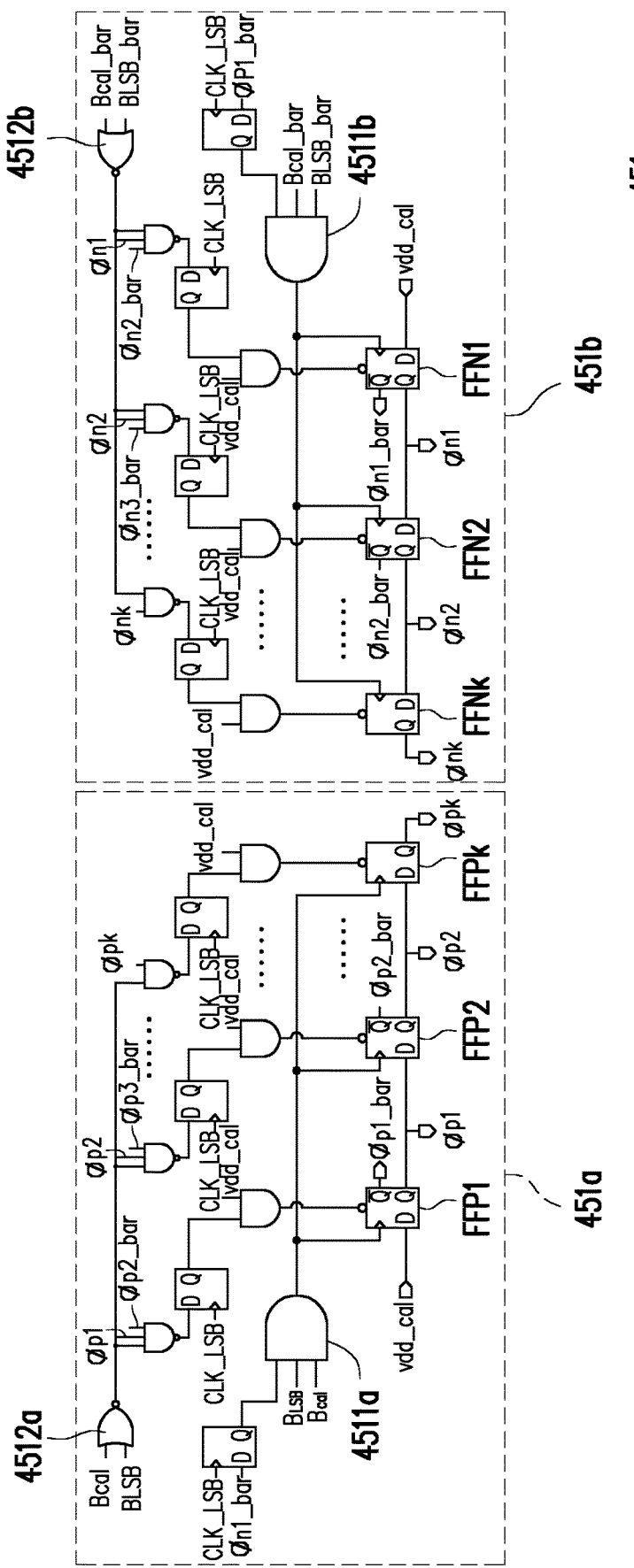
FIG. 4 is schematic diagram illustrating a detail structure of a calibration circuit of a SAR ADC in accordance with some embodiments.

FIG. 4 shows a detection circuit 451 that includes a first detection circuit 451a and a second detection circuit 451b in accordance with some embodiments. The first detection circuit 451a is configured to generate a plurality of control signals $\phi p1$ through $\phi pk$ according to the comparison results $B_{LSB}$ and Bcal, in which k is a natural number. The second detection circuit 451b is configured to generate a plurality of control signals $\phi n1$ through $\phi nk$ according to values of $B_{LSB}$_bar and Bcal_bar, in which the values of $B_{LSB}$_bar and Bcal_bar are inverted values of $B_{LSB}$ and Bcal.

In some embodiments, the first detection circuit 451a includes a logic circuit 4511a, a logic circuit 4512a and a plurality of flip-flops FFP1 through FFPk. The logic circuit 4511a is configured to determine whether the value of the LSB $B_{LSB}$ is same as the value of the calibration bit Bcal. In some embodiments, the logic circuit 4511a is an AND gate that is configured to perform an AND logic operation to determine whether the value of the LSB $B_{LSB}$ is same as the value of the calibration bit Bcal.

The logic circuit 4512a is configured to keep tracking an offset variation based on the LSB $B_{LSB}$ and the calibration bit Bcal. By keep tracking the offset variation of the comparator through the LSB $B_{LSB}$ and the calibration bit Bcal, the logic circuit 4512a may determine whether a polarity of the offset changes. The logic circuit 4512a may reset the control signals $\phi p1$ through $\phi pk$ via the flip-flops FFP1 through FFPk when it determines that the polarity of the offset changes. In some embodiments, the logic circuit 4512a is a NOR gate that is configured to perform a NOR logic operation to the LSB $B_{LSB}$ and the calibration bit Bcal, but the disclosure is not limited thereto. The flip-flops FFP1 through FFPk are configured to generate the control signals $\phi p1$ through $\phi pk$ according to outputs of the logic circuits 4511a and 4512a.

In some embodiments, the second detection circuit 451b includes a logic circuit 4511b, a logic circuit 4512b and a plurality of flip-flops FFN1 through FFNk. The logic circuit 4511b is configured to determine whether the value of the bit $B_{LSB}$_bar is same as the value of the bit Bcal_bar. The logic circuit 4512b is configured to keep tracking an offset variation based on the bit $B_{LSB}$_bar and the bit Bcal_bar. By keep tracking the offset variation of the comparator, the logic circuit 4512b may determine whether a polarity of the offset changes. The logic circuit 4512b may reset the control signals $\phi n1$ through $\phi nk$ via the flip-flops FFN1 through FFNk when it determines that the polarity of the offset changes. The flip-flops FFN1 through FFNk are configured to generate the control signals $\phi n1$ through $\phi nk$ according to outputs of the logic circuits 4511b and 4512b. In some embodiments, the logic circuit 4511b is an AND gate and the logic circuit 4512b is a NOR gate, but the disclosure is not limited thereto.

In some embodiments, the control signals $\phi p1$ through $\phi pk$ and $\phi n1$ through $\phi nk$ generated by the first and second detection circuits 451a and 451b are used to correct the offset of the comparator. In some embodiments, the detection circuit 451 is operated in a background without interrupting the ADC operation. In this way, the performance of the SAR ADC is improved.

Figure 5:
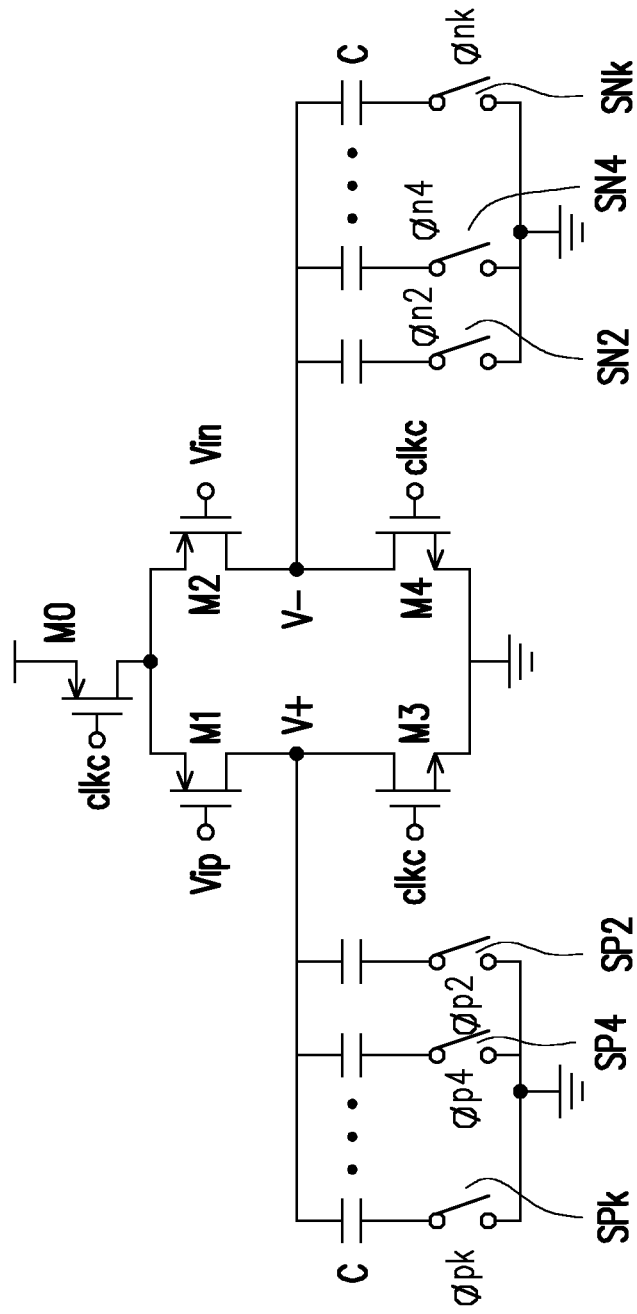
FIG. 5 is schematic diagram illustrating a comparator of a SAR ADC in accordance with some embodiments.

FIG. 5 shows a comparator 530 in accordance with some embodiments of the disclosure. The comparator 530 includes a first pair of transistors M1 and M2, a second pair of transistors M3 and M4, and a transistor M0. The transistor M0 may serve as a current source; the first pair of transistors M1 and M2 are configured to receive the input signals Vip and Vin; and the second pair of transistors M3 and M4 receive a clock signal clkc. The comparator 530 is configured to compare the input signals Vip and Vin and output the comparison results (V+, V−) at connection node between the transistors M1 and M3 and a connection node between the transistors M2 and M4.

In some embodiments, the comparator 530 may further include a plurality of capacitors C and a plurality of switches SP2 through SPk and SN2 through SNk, in which each of the switches SP2 through SPk and SN2 through SNk is coupled between a reference node and one of the capacitors C. The reference node may receive a reference voltage (e.g., voltage with a ground voltage level). Each of the capacitors C of the comparator 530 is coupled to the one of the connection nodes that output the comparison results (V+, V−) of the comparator 530. Each of the switches SP2 through SPk and SN2 through SNk is controlled to be switched on or off according to a control signal among the control signals $\phi p2$ through $\phi pk$ and $\phi n2$ through $\phi nk$. For example, the switches SP2 through SPk are controlled by the control signals $\phi p2$ through $\phi pk$; and the switches SN2 through SNk are controlled by the control signals $\phi n2$ through $\phi nk$. The control signals $\phi p2$ through $\phi pk$ and $\phi n2$ through $\phi nk$ are generated by the detecting circuit (e.g., detecting circuit 451 as shown in FIG. 4). The comparator 530 is configured to switch on or off each of the switches SP2 through SPk and SN2 through SNk according to the control signals $\phi p2$ through $\phi pk$ and $\phi n2$ through $\phi nk$ to correct the offset of the comparator 530.

FIG. 6A illustrates signal waveforms of a SAR ADC that includes an offset-free comparator in accordance with some embodiments. The signals P and N are inputted to the comparator of the SAR ADC (e.g., the comparator 130 of the SAR ADC 100 illustrated in FIG. 1). In time periods T0, T1, T2 and T3, comparison operations are performed to determine values of bits B0, B1, B2 and $B_{LSB}$, respectively. After the value of $B_{LSB}$ is determined, a swapping operation is performed to interchange the signals P and N. As a result of the swapping operation, the signal P before the swapping operation is the signal N after the swapping operation; and the signal N before the swapping operation is the signal P after the swapping operation. The arrows ARR1 and ARR2 shown in FIG. 6A illustrate the swapping operation. In the period T4 after the swapping operation, a comparison operation is performed to compare the swapped signals P and N to determine the calibration bit Bcal. The values of the LSB $B_{LSB}$ and the calibration bit Bcal are used to detect and correct the offset of the comparator 130.

In some embodiments, when the value of the LSB $B_{LSB}$ is different from the value of the calibration bit Bcal, it determines that the comparator of the SAR ADC is offset-free comparator. As shown in FIG. 6A, the value of the LSB $B_{LSB}$ is "0" which is different from the value (e.g., "1") of the calibration bit Bcal. In this way, whether the comparator of the SAR ADC has offset is determined according to the values of LSB $B_{LSB}$ and the calibration bit Bcal.

FIG. 6B illustrates signal waveforms of a SAR ADC that includes a comparator with offset in accordance with some embodiments. As a result of the offset, the signal P which is influenced by the offset is represented as dotted lines OFS_P. After the swapping operation is performed, the swapped signals are compared to determine the value of the calibration bit. As the example shown in FIG. 6B, the value of the calibration bit Bcal is "1" which is same as the value of the LSB $B_{LSB}$. As Such, it may determine that the comparator has offset.

In some embodiments, a polarity of offset (e.g., positive offset or negative offset) may be determined according to the values of the LSB $B_{LSB}$ and calibration bit Bcal. For example, when the LSB $B_{LSB}$ is same as calibration bit Bcal at a high logic state (e.g., "1"), the offset of the comparator is the positive offset. When the LSB $B_{LSB}$ is same as calibration bit Bcal at a low logic state (e.g., "0"), the offset of the comparator is the negative offset.

If the comparator has the offset, a voltage difference of the swapped signals after the swapping operation is larger than a voltage difference of the signals before the swapping operation. As such, it is beneficial for the comparator to determine the value of the calibration bit Bcal. Besides, this can significantly diminish the probability of metastability compared to other offset calibration techniques.

Figure 7:
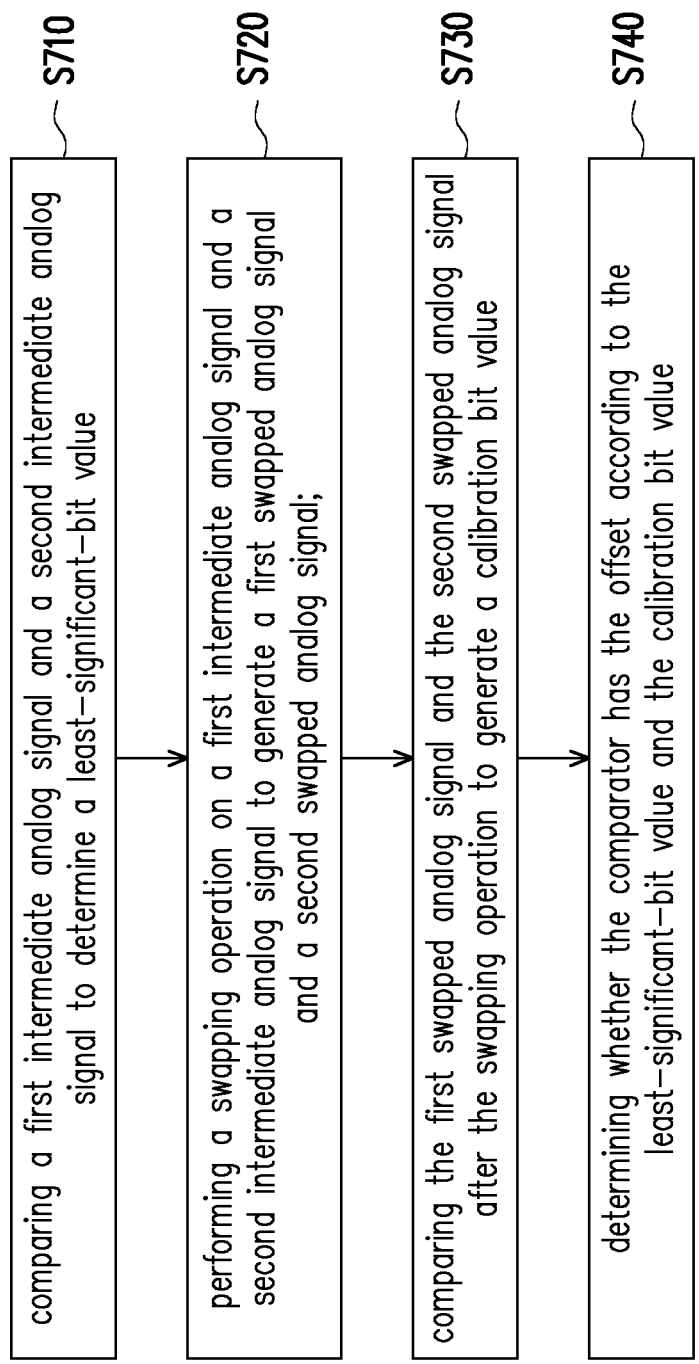
FIG. 7 is a flowchart diagram illustrating a method of detecting offset of a comparator in accordance with some embodiments.

Referring to FIG. 7, a method of detecting offset of a comparator of a SAR ADC in accordance with some embodiments is illustrated. In step S710, a first intermediate analog signal is compared with a second intermediate analog signal to determine a least-significant-bit value. In step S720, a swapping operation is performed on a first intermediate analog signal and a second intermediate analog signal to generate a first swapped analog signal and a second swapped analog signal. In step S730, the first swapped analog signal is compared with the second swapped analog signal after the swapping operation to generate a calibration bit value. In step S740, whether the comparator has the offset is determined according to the least-significant-bit value and the calibration bit value.

From the above embodiments, offset detection technique is performed based on a swapping operation on a first intermediate analog signal and a second intermediate analog signal to generate a first swapped analog signal and a second swapped analog signal. Before the swapping operation is performed, the first intermediate analog signal is compared with the second intermediate analog signal to determine a least-significant-bit value. After the swapping operation is performed, the first swapped analog signal is compared with the second swapped analog signal to generate the calibration bit value. The least-significant-bit value and the calibration bit value are used to detect whether the comparator has the offset, a polarity of the offset and is used to generate a plurality of control signal to correct the detected offset. In the present application, the offset detection and calibration technique may be performed in background which is well embedded in the SAR ADC operation. The offset detection and calibration technique does not require dummy channel/comparator, but only needs a few simple auxiliary digital circuits. As a result, the performance of the ADC is improved at a low manufacturing cost.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A successive approximation register (SAR) analog to digital converter (ADC), comprising:
   a switch circuit, configured to perform a swapping operation on a first intermediate analog signal and a second intermediate analog signal to generate a first swapped analog signal and a second swapped analog signal according to a control signal;
   a comparator, coupled to the switching circuit, configured to compare the first intermediate analog signal and the second intermediate analog signal before the swapping operation to generate a least-significant-bit value, and compare the first swapped analog signal and the second swapped analog signal after the swapping operation to generate a calibration bit value;
   a calibration circuit, configured to determine whether the comparator has an offset according to the least-significant-bit value and the calibration bit value; and
   a SAR logic, coupled to the comparator and the calibration circuit, configured to output a digital output according to a comparison result of the comparator and output the control signal.

2. The SAR ADC of claim 1, further comprising:
   a first capacitor may, coupled to the switching circuit, configured to generate the first intermediate analog signal according to a first analog input signal;
   a second capacitor array, coupled to the switching circuit, configured to generate the second intermediate analog signal according to a second analog input signal.

3. The SAR ADC of claim 1, wherein
   the calibration circuit determines that the comparator has no offset in response to determining that the least-significant-bit value is different from the calibration bit value; and
   the calibration circuit determines that the comparator has the offset in response to determining that the least-significant-bit value is same as the calibration bit value.

4. The SAR ADC of claim 3, wherein
   in response to determining the that the least-significant-bit value is same as the calibration bit value and the least-significant-bit value and the calibration bit value are in a first logic state, the calibration circuit determines that the offset of the comparator is a positive offset; and
   in response to determining that the least-significant-bit value is same as the calibration bit value and the least-significant-bit value and the calibration bit value are in a second logic state, the calibration circuit determines that the offset of the comparator is a negative offset.

5. The SAR ADC of claim 1, wherein the switching circuit comprises:
   a first switch input terminal, configured to receive the first intermediate analog signal;
   a second switch input terminal, configured to receive the second intermediate analog signal;
   a first switch output terminal, coupled to a first comparator input of the comparator; and
   a second switch outputterminal, coupled to a second comparator input of the comparator.

6. The SAR ADC of claim 5, wherein the switching circuit further comprises a plurality of switches, wherein
   each of the plurality of switches is coupled between one of the first switch input terminal and the second switch input terminal and one of the first switch output terminal and the second switch output terminal, the plurality of switches are configured to provide the first intermediate analog signal and the second intermediate analog signal respectively to the first switch output terminal and the second switch output terminal before the swapping operation, the plurality of switches are further configured to provide the first swapped analog signal and the second swapped analog signal respectively to the first switch output terminal and the second switch output terminal after the swapping operation, the first intermediate analog signal before the swapping operation is the second swapped analog signal after the swapping operation; and the second intermediate analog signal before the swapping operation is the first swapped analog signal after the swapping operation.

7. The SAR ADC of claim 1, wherein the calibration circuit comprises:
a detection circuit, configured to determine whether the comparator has the offset and track an offset variation according to the least-significant-bit value and the calibration bit value.

8. The SAR ADC of claim 7, wherein the detection circuit comprises:
a first logic circuit, configured to detect whether the comparator has the offset according to the least-significant-bit value and the calibration bit value; and
a second logic circuit, configured to track the offset variation of the comparator according to the least-significant-bit value and the calibration bit value to determine a change of a polarity of the offset,
wherein the detection circuit outputs a plurality of control signals according to the offset detected by the first logic circuit and the offset variation.

9. The SAR ADC of claim 8, wherein the comparator comprises:
a plurality of correction switches, wherein control terminals of the plurality of correction switches receive the plurality of control signals from the detection circuit; and
a plurality of capacitor, coupled between the plurality of correction switches and the plurality of switches,
wherein the plurality of correction switches are controlled to correct the offset detected by the detection circuit according to the plurality of control signals.

10. A method of detecting an offset of a comparator, comprising:
comparing a first intermediate analog signal and a second intermediate analog signal to determine a least-significant-bit value;
performing a swapping operation on the first intermediate analog signal and the second intermediate analog signal to generate a first swapped analog signal and a second swapped analog signal according to a control signal from a SAR logic coupled to the comparator;
comparing the first swapped analog signal and the second swapped analog signal after the swapping operation to generate a calibration bit value; and
determining whether the comparator has the offset according to the least-significant-bit value and the calibration bit value.

11. The method of claim 10, further comprising:
generating the first intermediate analog signal according to a first input signal;
generating the second intermediate analog signal according to a second input signal; and
outputting a digital output according to a comparison result of the comparator.

12. The method of claim 10 wherein determining whether the comparator has the offset according to the least-significant-bit value and the calibration bit value comprises:
determining that the comparator has no offset in response to determining that the least-significant-bit value is different from the calibration bit value; and
determining that the comparator has the offset in response to determining that the least-significant-bit value is same as the calibration bit value.

13. The method of claim 12, further comprising:
in response to determining that the least-significant-bit value is same as the calibration bit value and the least-significant-bit value and the calibration bit value are in a first logic state, determining that the offset of the comparator is a positive offset; and
in response to determining that the least-significant-bit value is same as the calibration bit value and the least-significant-bit value and the calibration bit value are in a second logic state, determining that the offset of the comparator is a negative offset.

14. The method of claim 10, wherein performing the swapping operation on the first intermediate analog signal and the second intermediate analog signal to generate the first swapped analog signal and the second swapped analog signal comprises:
controlling a plurality of switches to provide the first intermediate analog signal and the second intermediate analog signal to the comparator before the swapping operation; and
controlling the plurality of switches to provide the first swapped analog signal and the second swapped analog signal to the comparator after the swapping operation,
wherein the first intermediate analog signal before the swapping operation is the second swapped analog signal after the swapping operation, and the second intermediate analog signal before the swapping operation is the first swapped analog signal after the swapping operation.

15. The method of claim 10, further comprising:
tracking an offset variation of the comparator according to the least-significant-bit value and the calibration bit value to determine a change of a polarity of the offset;
outputting a plurality of control signals according to the offset and the offset variation; and
correcting the offset according to the plurality of control signals.

16. The method of claim 15, wherein correcting the offset according to the plurality of control signals comprises:
controlling a plurality of correction switches that are coupled to the comparator through a plurality of capacitors to compensate the offset of the comparator.

* * * * *